United States Patent
Ono et al.

(10) Patent No.: US 9,170,274 B2
(45) Date of Patent: Oct. 27, 2015

(54) WIRING BOARD FOR ELECTRONIC PARTS INSPECTING DEVICE AND ITS MANUFACTURING METHOD

(75) Inventors: Tomoyoshi Ono, Nagoya (JP); Kazushige Akita, Nagoya (JP); Toshihisa Nomura, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 440 days.

(21) Appl. No.: 13/414,343

(22) Filed: Mar. 7, 2012

(65) Prior Publication Data

US 2012/0229160 A1 Sep. 13, 2012

(30) Foreign Application Priority Data

Mar. 7, 2011 (JP) .................................. 2011-048522
Oct. 12, 2011 (JP) .................................. 2011-224601

(51) Int. Cl.
  *G01R 31/00* (2006.01)
  *G01R 1/04* (2006.01)
(52) U.S. Cl.
  CPC ......................................... *G01R 1/04* (2013.01)
  USPC .................................. 324/756.07; 324/756.01
(58) Field of Classification Search
  CPC .......................... G01R 31/3606; G01R 31/2886
  USPC ............. 324/750.01–757.05, 756.07, 754.18, 324/757.07
  See application file for complete search history.

(56) References Cited

U.S. PATENT DOCUMENTS 5,258,330 A 11/1993 Khandros et al.
5,258,648 A 11/1993 Lin
5,550,406 A 8/1996 McCormick
5,828,226 A 10/1998 Higgins et al.
6,432,239 B1 8/2002 Mandai et al.
6,938,332 B2 9/2005 Harada et al.
7,459,795 B2 12/2008 Eldridge et al.

(Continued)

FOREIGN PATENT DOCUMENTS

CN 1171167 A 1/1998
CN 1307793 A 8/2001

(Continued)

OTHER PUBLICATIONS

English translation 10-2004-0022445.*

(Continued)

*Primary Examiner* — Vincent Q Nguyen
(74) *Attorney, Agent, or Firm* — Stites & Harbison, PLLC; Jeffrey A. Haeberlin; James R. Hayne

(57) ABSTRACT

A wiring board for an electronic parts inspecting device that can be designed and produced relatively quickly, inexpensively, and with few jigs is provided. In certain embodiments the wiring board includes a base board made of an insulating material having a front surface and a back surface, the base board including a plurality of first via conductors as well as first terminals on the front surface and outer terminals on the back surface that are connected to the ends of the first via conductors, and a mounting board on the front surface of the base board having a front side that includes, a plurality of probe pads, a plurality of second terminals that are electrically connected to the first terminals of the base board, and front surface wirings that connect the probe pads to the second terminals. Lastly, a method of manufacturing the same is provided.

8 Claims, 6 Drawing Sheets

(56) References Cited

U.S. PATENT DOCUMENTS

| | | | |
|---|---|---|---|
| 7,466,152 B2 | 12/2008 | Shioga et al. | |
| 7,489,518 B2 | 2/2009 | Matsuda | |
| 7,534,654 B2 * | 5/2009 | Pedersen et al. | 438/110 |
| 7,550,844 B2 | 6/2009 | Matsuki et al. | |
| 7,601,235 B2 | 10/2009 | Murata et al. | |
| 7,833,370 B2 | 11/2010 | Kawamura et al. | |
| 7,884,006 B2 | 2/2011 | Eldridge et al. | |
| 7,884,632 B2 * | 2/2011 | Shiraishi et al. | 324/750.25 |
| 7,898,276 B2 | 3/2011 | Williams et al. | |
| 7,911,805 B2 | 3/2011 | Haba | |
| 8,089,775 B2 | 1/2012 | Matsuda | |
| 8,395,260 B2 | 3/2013 | Matsuki et al. | |
| 2003/0003862 A1 | 1/2003 | Yoshida et al. | |
| 2003/0010976 A1 | 1/2003 | Grube et al. | |
| 2003/0025172 A1 | 2/2003 | Grube et al. | |
| 2003/0168253 A1 | 9/2003 | Khandros et al. | |
| 2005/0122030 A1 * | 6/2005 | Sakamoto et al. | 313/496 |
| 2006/0091510 A1 | 5/2006 | Liu et al. | |
| 2006/0279300 A1 | 12/2006 | Khandros et al. | |
| 2008/0129319 A1 * | 6/2008 | Beaman et al. | 324/754 |
| 2008/0138576 A1 | 6/2008 | Nozu et al. | |
| 2008/0272794 A1 | 11/2008 | Grube et al. | |
| 2009/0039339 A1 | 2/2009 | Yamada et al. | |
| 2009/0039906 A1 * | 2/2009 | Yamada et al. | 324/754 |
| 2009/0206861 A1 | 8/2009 | Shiraishi et al. | |
| 2009/0321114 A1 | 12/2009 | Takahashi et al. | |
| 2010/0065963 A1 | 3/2010 | Eldridge et al. | |
| 2010/0102837 A1 | 4/2010 | Abe et al. | |
| 2010/0103634 A1 | 4/2010 | Funaya et al. | |
| 2010/0308854 A1 | 12/2010 | Garabedian et al. | |
| 2012/0081140 A1 | 4/2012 | Shim et al. | |
| 2012/0228017 A1 * | 9/2012 | Ono et al. | 174/262 |
| 2012/0247821 A1 | 10/2012 | Nomura et al. | |
| 2012/0306523 A1 | 12/2012 | Kwon et al. | |
| 2013/0265073 A1 | 10/2013 | Nakano et al. | |

FOREIGN PATENT DOCUMENTS

| | | | |
|---|---|---|---|
| CN | 1390075 | A | 1/2003 |
| CN | 101256202 | A | 9/2008 |
| CN | 101346813 | A | 1/2009 |
| EP | 0520841 | A1 | 12/1992 |
| EP | 0795200 | B1 | 9/1997 |
| JP | H07-058241 | A | 3/1995 |
| JP | H09-186453 | A | 7/1997 |
| JP | 2008-197118 | A | 8/2008 |
| JP | 2010-210478 | A | 9/2010 |
| JP | 2011-002408 | A | 1/2011 |
| KR | 10-2004-0022445 | A | 12/2004 |
| KR | 10-2009-0120513 | A | 11/2009 |

OTHER PUBLICATIONS

USPTO, Office Action dated Sep. 16, 2014, in related U.S. Appl. No. 13/414,317.

USPTO, Office Action dated Mar. 14, 2014, in related U.S. Appl. No. 13/414,317.

The State Intellectual Property Office of P.R. China, First Office Action, issued in corresponding Chinese Application No. 201210058936.0, issue/mail date Sep. 2, 2014.

The State Intellectual Property Office of P.R. China, Notification of First Office Action, issued in counterpart Chinese Application No. 201210058762.8, issue date Sep. 26, 2014.

Korean Intellectual Property Office, Office Action issued in counterpart Korean Application, issue date Feb. 13, 2015 (English translation not currently available).

Korean Intellectual Property Office, Office Action issued in counterpart Korean Application No. 10-2012-0023498, issue date Feb. 13, 2015.

Japan Patent Office, Office Action (Notification of Reasons for Refusal) issued in corresponding Japanese Patent Application No. 2011-224601, dispatch date Jun. 2, 2015.

* cited by examiner

WIRING BOARD FOR ELECTRONIC PARTS INSPECTING DEVICE AND ITS MANUFACTURING METHOD

CROSS REFERENCE TO RELATED APPLICATIONS

The present invention claims priority from Japanese Patent Application No. 2011-048522, which was filed on Mar. 7, 2011, and Japanese Patent Application No. 2011-224601, which was filed on Oct. 12, 2011, the disclosures of which are herein incorporated by reference in its entirety.

BACKGROUND OF THE INVENTION

1. Field of the Invention

The present invention relates to a wiring board for an electronic parts inspecting device, which is used for inspecting the electric conductivity or other property of an electronic part, and its manufacturing method.

2. Description of Related Art

In order to inspect the electric conductivity or other property of an electronic part, such as an IC chip or an LSI, a probe card is proposed in which a plurality of signal pads are formed for attaching a probe to a part near a central part on a front surface of a board made of an insulating material, such as ceramics. A plurality of inner wirings (signal vias) are individually laid which expand toward a plurality of terminals substantially uniformly provided on an entire part of a back surface of the board from the signal pads in the directions of outer side surfaces along the direction of thickness of the back surface side from the front surface side. For instance, see Japanese Patent Application No. 2008-197118.

However, when the inner wirings are provided to the board as in the above probe card, since the inner wirings need to be designed which respectively correspond to electronic parts to be inspected between layers of a multi-layer ceramic board, it is time consuming to design such a multi-layer ceramic board and a jig is required for forming via conductors or the inner wirings at prescribed positions for each ceramic layer. Accordingly, a problem arises that multi-layer ceramic boards cannot be manufactured and delivered in a short amount of time.

BRIEF SUMMARY OF THE INVENTION

It is an object of the present invention to provide a wiring board for an electronic parts inspecting device which can solve the problems described in the Background, shortening the time required to design and produce the wiring board, and that can be easily and inexpensively manufactured with a relatively small number of jigs.

A means for solving the above-described problems is devised on the basis that a wiring board mounted on a front surface of a base board has a plurality of via conductors passing through front and back surfaces thereof, probe pads, and terminals to be electrically connected (conducted) to the base board formed on the same front side (surface) of the mounting board, and the pads are connected to the terminals by front surface wirings.

That is, embodiments of the present invention provide a wiring board for an electronic parts inspecting device, comprising a base board made of an insulating material having a front surface and a back surface, the base board including, a plurality of first via conductors having two ends and passing between the front surface and the back surface, and first terminals on the front surface and outer terminals on the back surface that are connected to the ends of the first via conductors, the outer terminals being configured to electrically connect to an external part; and a mounting board on the front surface of the base board having at least a front side formed with an insulating material, the front side including, a plurality of probe pads for attaching probes, a plurality of second terminals that are electrically connected to the first terminals of the base board, and front surface wirings that connect the probe pads to the second terminals.

According to embodiments of the present invention, since the plurality of probe pads and the plurality of second terminals to be electrically connected to the first terminals of the base board are formed on the same front side (surface) of the mounting board, it is only necessary to form the front surface wirings for connecting the second terminals to the probe pads on the front side of the mounting board. As a result, in the mounting board, since inner wirings are not necessary and only the front surface wirings are required, the time necessary for designing and manufacturing inspecting circuits for inspecting electronic parts can be shortened. Further, the second terminals located on the front side (surface) of the mounting board are electrically connected to the first terminals located on the front surface of the base board through below-described bonding wires, and can be securely electrically connected to a mother board, such as a printed circuit board, through the first via conductors and the outer terminals of the base board. Accordingly, the wiring board for the electronic parts inspecting device can be provided which can precisely and rapidly carry out a prescribed inspection required for each of the electronic parts, can be designed in a short time, and can be easily manufactured by a small number of jigs relatively inexpensively.

A board main body of the base board is formed with a single layer or a plurality of layers of an insulating material such as ceramics or a resin.

Further, with regard to the base board, a interposer may be utilized that includes a base board main body having a front surface and a back surface and is made of an insulating material, a plurality of first via conductors formed so as to pass through the front surface and the back surface of the base board main body, and first terminals on the front surface side and outer terminals on the back surface side which are configured to electrically connect to an external part, that are connected to the ends of the first via conductors.

Further, the interposer used as the base board may be previously manufactured to include the first via conductors, the first terminals in the front surface of the base board main body, and the outer terminals in the back surface of the base board main body substantially uniformly arranged from a plane view, or may include the via conductors and the terminals respectively formed only in the peripheral portions (parts) of the front surface and the back surface from a plane view.

A board main body of the mounting board includes a structure in which most of the board main body, including a back surface side in the direction of thickness, is formed with a metal core board, and a relatively thin single layer or two or more layers of an insulating material are laminated only in the front side. The structure may also comprise a single layer or a plurality of layers of an insulating material, such as ceramics or a resin.

Further, the probe pad, the second terminals, and the front surface wirings formed on the front side (surface) of the mounting board may include a thin film formed on the front side or may be formed with the thin film such that the insulating material of the mounting board is composed of the ceramics.

In addition thereto, the front surface wirings formed on the front side of the mounting board include a wiring for a signal circuit to which a processing signal for an inspected electronic part is supplied, a wiring for a power circuit for feeding a power, and a wiring for a ground circuit connected to a ground. Accordingly, to the front surface wirings, chip shaped electronic parts such as a resistor, a capacitor, or a diode are connected.

Embodiments of the present invention also include a wiring board for an electronic parts inspecting device, wherein the probe pads are formed in a central portion (part or side) of the front side of the mounting board, the second terminals are formed in a peripheral portion (side) of the front side of the mounting board, and the peripheral portion surrounds (is outside) the central portion.

According to embodiments of the present invention, since the plurality of probe pads are located in the central portion of the front side of the mounting board and the second terminals are located in the peripheral portion of the front side of the mounting board that surrounds the probe pads, the front surface wirings can be collectively formed between the central portion and the peripheral portion on the front side. Further, a plurality of probes, which are respectively may stand upright on the pads, can be easily prevented from interfering with the bonding wires that individually electrically connect the second terminals to the first terminals located on the front surface of the base board.

The plurality of second terminals may have a rectangular shape from a plane view, and are formed on the front side of the mounting board in an area having a substantially tubular square shape from a plane view so as to surround the plurality of probe pads located in the central portion of the front side. The second terminals may also form a shape of U in plane view along three sides on the front surface so as to surround the plurality of probe pads, or it may also form two independent rectangular shapes in plane view along two opposed sides that sandwich the plurality of probe pads.

Embodiments of the present invention also include a wiring board for an electronic parts inspecting device, wherein a width of the probe pads, a width of the second terminals, and a width of the front surface wirings are the same.

According to embodiments of the present invention, since an electric resistance of the front surface wirings is lowered, the front surface wirings are preferably applied to a power source or an installed circuit.

When the probe pads and the second terminals have circular forms from a plane view, the width of the probe pads and the second terminals is a diameter thereof. When the probe pads and the second terminals have the below-described rectangular forms, elliptical forms, or oval forms from a plane view, the width of the probe pads and second terminals is a length of a short side or a minor axis.

Embodiments of the present invention also include a wiring board for an electronic parts inspecting device, further comprising an upper insulating layer and a lower insulating layer on the front side of the mounting board, inner wirings between the upper insulating layer and the lower insulating layer, and second via conductors that pass through the upper insulating layer, wherein one or more of the probe pads are electrically connected to one or more of the second terminals through the inner wirings and the second via conductors.

According to embodiments of the present invention, only in a case where the front surface wirings that connect the plurality of probe pads to the plurality of second terminals inevitably intersect with each other on the front side of the mounting board when viewed from a plane view is it necessary to have inner wirings and the second via conductors.

Preferably, a minimum number of such inner wirings and first via conductors are utilized. Thus, the wiring board for the electronic parts inspecting device can be securely designed and manufactured in a short time by mainly including the front surface wirings and including the minimum number of the inner wirings.

Embodiments of the present invention also include a wiring board for an electronic parts inspecting device, wherein the mounting board is mounted on the front surface of the base board by bonding a back side of the mounting board to the front surface of the base board or inserting the back side of the mounting board into a recessed part provided on the front surface of the base board.

According to embodiments of the present invention, since only the front surface wirings and, possibly, the minimum number of the inner wirings are formed in the mounting board, and the mounting board is formed integrally with the base board so as to be easily electrically connected to terminals of the mother board side. Thus, a wiring board for an electronic parts inspecting device which is highly reliable and practical can be obtained.

Embodiments of the present invention also include a wiring board for an electronic parts inspecting device, wherein the first terminals are connected to the second terminals by bonding wires or connectors.

According to embodiments of the present invention, in the mounting board or the base board, the inner wirings are not provided or the minimum number of inner wirings may be provided in the mounting board, and all or most of inspecting circuits are formed by the front surface wirings formed on the front side of the mounting board. Accordingly, the wiring board for the electronic parts inspecting device can be inexpensively provided, can be designed and manufactured in a relatively short span of time, and can precisely inspect the electronic parts to be inspected.

Embodiments of the present invention also include a wiring board for an electronic parts inspecting device, wherein from a plane view the first terminals and the second terminals have a rectangular shape, elliptic shape, oval shape, rhombic shape, or polygonal shape, and a long side or major axis of the first terminals and the second terminals are substantially located along a direction of the bonding wires or connectors.

According to embodiments of the present invention, since the directions of the bonding wires or connectors from a plane view are substantially parallel to long sides or major axes of the first terminals and the second terminals having rectangular forms, elliptic forms, or oval forms when viewed from a plane view, even when the wires are unexpectedly pulled, the wires hardly shift. The above-described polygons include modified polygons as well as regular polygons.

Meanwhile, embodiments of the present invention provide a manufacturing method of a wiring board for an electronic parts inspecting device, the wiring board including a base board made of an insulating material having a front surface and a back surface, the base board including, a plurality of first via conductors passing between the front surface and the back surface, and first terminals on the front surface and outer terminals on the back surface that are connected to the ends of the first via conductors, the outer terminals being configured to electrically connected to an external part, and a mounting board on the front surface of the base board having at least a front side formed with an insulating material, the front side including, a plurality of probe pads, a plurality of second terminals that are electrically connected to the first terminals of the base board, and front surface wirings that connect the probe pads to the second terminals, the method of manufacturing the wiring board comprising: sintering a green sheet having a front surface and a back surface to form a ceramic sheet, the green sheet having a plurality of board areas; and forming the plurality of probe pads, the plurality of second terminals, and the plurality of front surface wirings by applying a physical vapor deposition or a plating process to a front surfaces of the plurality of board areas to form a plurality of mounting boards.

According to embodiments of the present invention, since the probe pads, the second terminals, and the front surface wirings are formed by applying the physical vapor deposition method only to the front surface of the ceramic sheet obtained by sintering the green sheet, the time necessary for design or a production can be shortened and the wiring board can be easily and inexpensively manufactured with a relatively small number of jigs.

The physical vapor deposition process (method) (PVD) is a process for heating and evaporating metal particulates in vacuum to form a thin film, and includes, for instance, a vapor deposition method by electron beam heating, laser heating, or spattering method by an ion beam. Further, in order to manufacture the wiring board for the electronic parts inspecting device having the inner wirings and the second via conductors, after a green sheet of an upper layer side which the via conductors are previously allowed to penetrate and a green sheet of a lower layer side having the inner wirings formed on a front surface thereof are laminated, the above-described processes are respectively applied thereto to manufacture the wiring board. Further, the base board is formed by allowing the plurality of first via conductor to pass through as well as printing and forming the first terminals and the outer terminals on both front and back surfaces of the first via conductors and then sintering them, or an ordinary interposer is used. After the mounting board is mounted on the front surface of the base board, the bonding wires are provided between the first terminals and the second terminals. Thus, the wiring board for the electronic parts inspecting device can be manufactured.

Embodiments of the present invention also include a manufacturing method of a wiring board for an electronic parts inspecting device, further comprising dividing the ceramic sheet to separate the plurality of board areas to form a plurality of mounting boards after the process of forming the probe pads, the second terminals, and the front surface wirings.

According to embodiments of the present invention, the plurality of wiring boards for the electronic parts inspecting devices can be efficiently provided for a relatively short period.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

An exemplary embodiment for carrying out the present invention will be described in detail with reference to the drawings.

Figure 1:
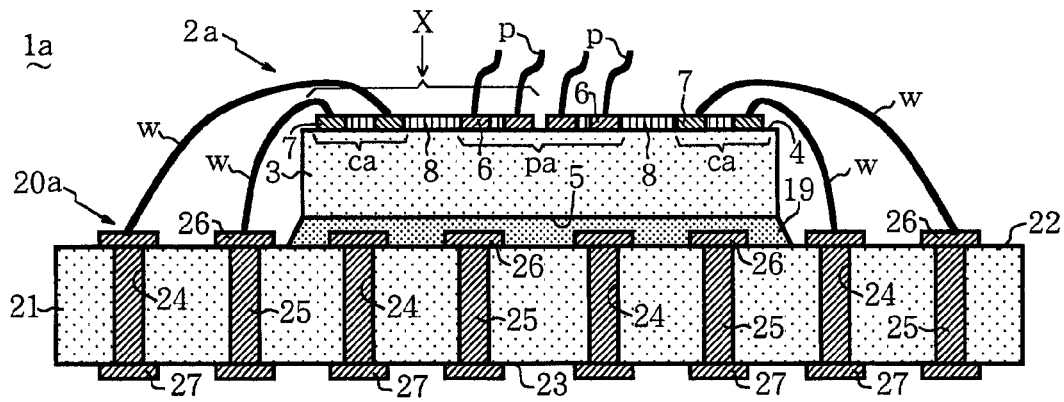
FIG. 1 is a vertical sectional view showing a wiring board for an electronic parts inspecting device according to one exemplary embodiment the present invention.
Figure 2:
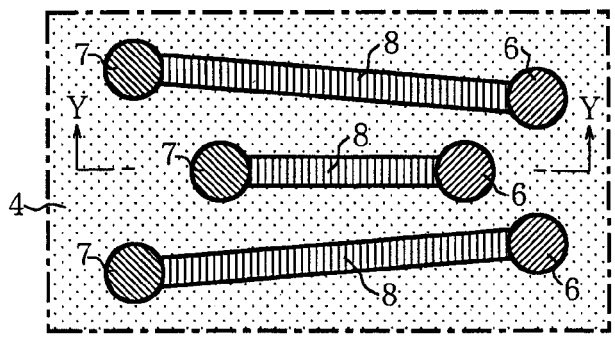
FIG. 2 is an enlarged plane view showing section X of FIG. 1.
Figure 3:
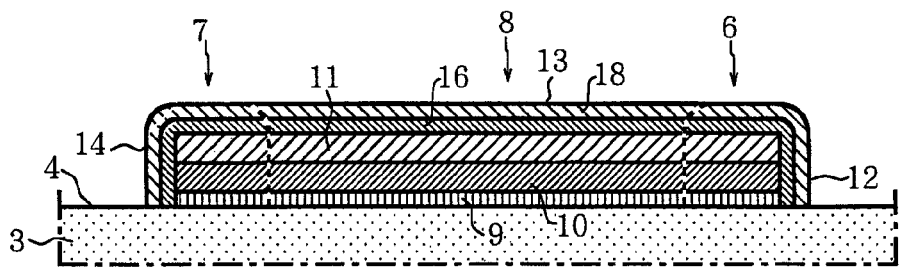
FIG. 3 is a vertical sectional view taken along a line Y-Y of FIG. 2.

FIG. 1 is a vertical sectional view showing a wiring board for an electronic parts inspecting device (hereinafter "wiring board") 1a of one exemplary embodiment according to the present invention. FIG. 2 is an enlarged plane view showing section X of FIG. 1. FIG. 3 is a vertical sectional view taken along a line Y-Y of FIG. 2.

As shown in FIG. 1, the wiring board 1a includes a flat plate shaped base board 20a and a mounting board 2a mounted on a front surface 22 of the base board 20a.

The base board 20a includes a board main body 21 made of, for instance, high temperature sintered ceramics (e.g., an insulating material) such as alumina, and having a front surface 22 and a back surface 23 substantially with square forms from a plane view, a plurality of first via conductors 25 formed respectively for a plurality of via holes 24 passing through the front surface 22 and the back surface 23 of the board main body 21, a plurality of first terminals 26 respectively connected to end parts of the first via conductors 25 on the front surface 22 side, and a plurality of outer terminals 27 respectively connected to end parts of the first via conductors 25 on the back surface 23 side that may also be used to be electrically connect to an external part.

The base board 20a mentioned above may be also referred to as a interposer.

When the board main body 21 is formed with alumina, the first via conductors 25, the first terminals 26 and the outer terminals 27 are mainly formed with W or Mo. When the board main body 21 is formed with glass-ceramics, such as low temperature sintered ceramics (the insulating material), the first via conductors 25, the first terminals 26, and the outer terminals 27 are formed with Cu or Ag.

As shown in FIG. 1 and FIG. 2, the mounting board 2a includes: a flat plate shaped board main body 3 made of the ceramics described above and a front surface 4 and a back surface 5 substantially having square shapes from a plane view, a plurality of probe pads 6 formed in a central side on the front surface 4 of the board main body 3, a plurality of second terminals 7 formed in a peripheral side of the front surface 4 of the board main body 3 that is outside the pads 6 and is electrically connected to the first terminals 26 of the base board 20a through bonding wires w, and a plurality of front surface wirings 8 formed on the front surface 4 of the board main body 3 for individually connecting the probe pads 6 to the second terminals 7.

Specifically, as shown in FIG. 1, the plurality of probe pads 6 are formed in a probe pad area pa having a substantially square shape from a plane view and located in the central side of the front surface 4 of the board main body 3, and the plurality of second terminals 7 are formed in a second terminal area ca having a substantially tubular square shape from a plane view and located in the peripheral side of the front surface 4 of the board main body 3 and outside the probe pad area pa. On the front surface 4 between the two areas of the probe pad area pa and the second terminal area ca, the plurality of front surface wirings 8 are formed substantially in radial directions from a plane view. The front surface wirings 8 include a wiring for a signal circuit to which a processing signal for inspecting electronic parts is supplied, a wiring for a power circuit for feeding a power, and a wiring for a ground circuit connected to a ground (none shown in the drawing).

As shown in FIG. 3, as an example, the probe pads 6, the front surface wirings 8, and the second terminals 7 are formed as described below. On the front surface 4 of the board main body 3 adjusted to be flat, a Ti thin film layer 9 and a Cu thin film layer 10 of prescribed patterns, including circular parts at both ends and intermediate linear parts from a plane view, are sequentially laminated by a physical vapor deposition method such as a spattering method and photography technique. Then, a Cu plating layer 11 having a similar form from a plane view is formed on the Cu thin film layer 10 to form substantially cylindrical parts 12 and 14 at both ends and a linear part 13 as an intermediate part. Further, after a plating resist (not shown) formed in the periphery of the Cu plating layer 11 is removed, an outer side surface of the above-described Ti thin film layer 9, Cu thin film layer 10, and Cu plating layer 11 is sequentially coated with an Ni plating layer 16 and an Au plating layer 18 respectively by an electrolytic plating process. The front surface wirings 8 may partly include a curved part from a plane view.

The board main body 21 of the base board 20a and the board main body 3 of the mounting board 2a are respectively formed with single ceramic layers or laminated bodies having a plurality of ceramic layers.

As shown in FIG. 1, to upper parts of the probe pads 6, probes p are attached to stand upright and can come into electrical contact with a plurality of electronic parts (not shown) to be inspected that are provided together with, for instance, Si wafers. Further, to a central part of the front surface 22 of the base board 20a, the back surface 5 side of the mounting board 2a is bonded with a bonding agent 19, so that the mounting board 2a is mounted on the front surface 22 of the base board 20a. Further, the first terminals 26 located in a periphery of the front surface 22 of the base board 20a are individually connected to the second terminals 7 of the mounting board 2a later by the bonding wires w. Thus, any of the outer terminals 27 can be individually electrically connected to the probes p.

According to the wiring board 1a, since the plurality of probe pads 6, located in the central side of the front surface 4 of the mounting board 2a, and the plurality of second terminals 7, located in the peripheral side of the front surface 4 so as to surround the probe pads 6 and being electrically connected to the first terminals 26 of the base board 20a, are formed on the same front surface of the mounting board, the front surface wirings 8 for connecting the second terminals 7 to the probe pads 6 can be formed only on the front surface 4 of the mounting board 2a. As a result, in the mounting board 2a, since inner wirings are not necessary and only the front surface wirings 8 are required, a period necessary for designing and manufacturing inspecting circuits for the electronic parts to be inspected can be shortened. Further, the second terminals 7 located on the front surface 4 of the mounting board 2a are electrically connected later to the first terminals 26 located on the front surface 22 of the base board 20a through bonding wires w, and can be securely electrically connected to a mother board, such as a printed circuit board, through the first via conductors 25 and the outer terminals 27 of the base board 20a. Further, the board main body 3 of the mounting board 2a may be previously manufactured or an existing interposer may be applied to the base board 20a.

Accordingly, a wiring board 1 a for the electronic parts inspecting device can be provided which can precisely and rapidly carry out a prescribed inspection required for electronic parts, can be easily designed and manufactured in a short span of time, and is relatively inexpensive.

Figure 4:
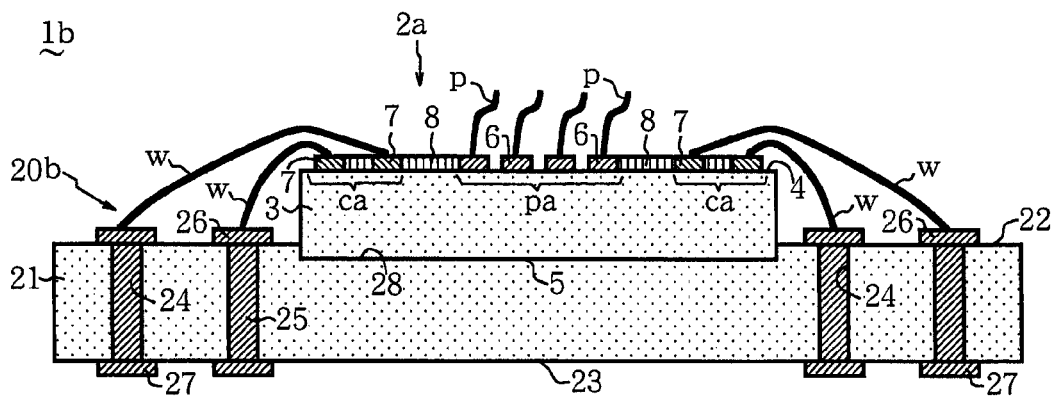
FIG. 4 is a vertical sectional view showing an applied form of the wiring board for an electronic parts inspecting device.

FIG. 4 is a vertical sectional view showing another wiring board 1b. The wiring board 1b includes the same mounting board 2a as described above and a base board 20b on which the mounting board 2a is mounted in a front surface 22.

The base board 20b includes a board main body 21 similar to the above-described board main body, a plurality of first via conductors 25 which pass through only a peripheral side of a front surface 22 and a back surface 23 of the board main body 21, first terminals 26 in the front surface 22 side and outer terminals 27 in the back surface 23 side which are individually connected to both ends of the via conductors 25, and a recessed part 28 having a rectangular form from a plane view and opened upwardly from a central part of the front surface 22.

As shown in FIG. 4, after a back surface 5 side of the mounting board 2a is inserted into the recessed part 28 of the base board 20b so that the mounting board 2a is mounted on the front surface 22 side of the base board 20b, probes p are allowed to stand upright respectively on upper parts of probe pads 6 as described above, and the first terminals 26 located in the front surface 22 side of the base board 20b are individually connected to second terminals 7 of the mounting board 2a by bonding wires w. Thus, any of the outer terminals 27 can be individually electrically connected to the probes p.

Wiring board 1b may achieve the same effects as those of the wiring board 1a. The base board 20b may be previously manufactured.

Figure 5:
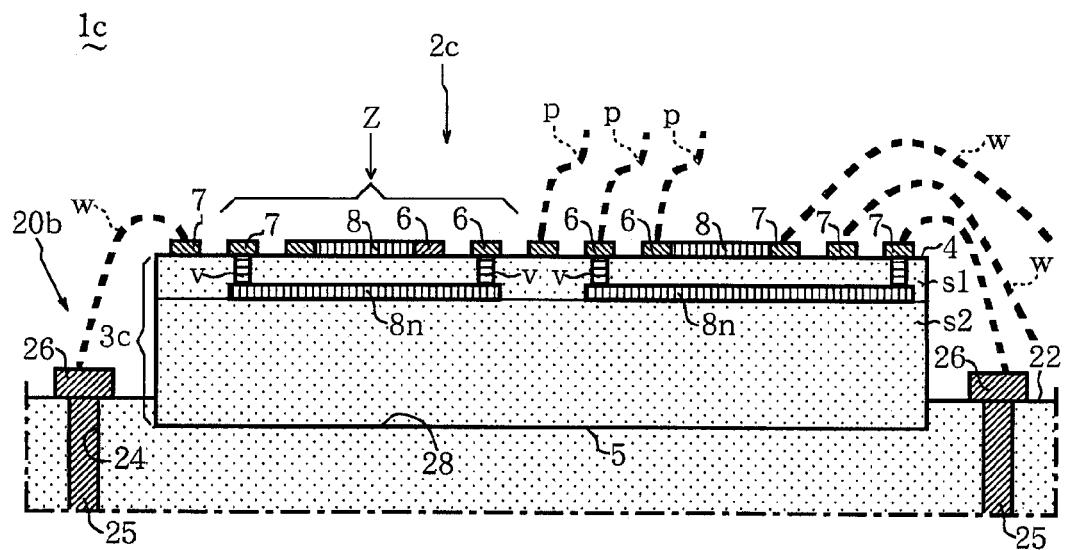
FIG. 5 is a vertical sectional view showing a wiring board for an electronic parts inspecting device according to a different exemplary embodiment.
Figure 6:
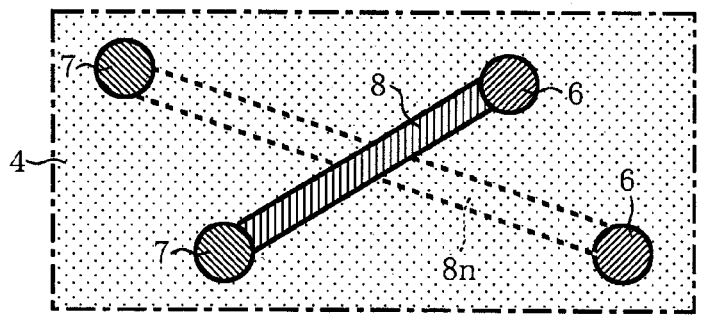
FIG. 6 is an enlarged plane view showing section Z of FIG. 5.

FIG. 5 is a vertical sectional view showing a wiring board 1c of a different exemplary embodiment. FIG. 6 is an enlarged plane view showing section Z of FIG. 5. As shown in FIG. 5, the wiring board 1c includes the base board 20b and a mounting board 2c that is mounted on the front surface 22 of the base board 20b by inserting a back surface 5 into the recessed part 28 of the base board 20b.

The mounting board 2c includes a board main body 3c in which a relatively thin ceramic layer s1 in a front surface 4 and a relatively thick ceramic layer s2 including the back surface 5 side are laminated, a plurality of probe pads 6, a plurality of second terminals 7 and front surface wirings 8 formed on the front surface 4 of the board main body 3c in the same manner as described above, inner wirings 8n formed between the ceramic layers s1 and s2, and second via conductors v that individually connect both end parts of the inner wirings 8n to the pads 6 or the second terminals 7 and that pass through the ceramic layer s1.

For the mounting board 2c, below is described a reason for why between the ceramic layers s1 and s2, located in the front surface 4 side of the board main body 3c, the inner wirings 8n and the second via conductors v are formed which pass through the ceramic layer s1. As shown in FIG. 6, a different front surface wiring 8 is necessary when they otherwise inevitably intersect when connecting the probe pads 6 to the second terminals 7. One should avoid the potential for two or more of the front surface wirings 8 short-circuiting on the front surface 4.

The inner wirings 8n and the second via conductors v are mainly formed with W or Mo, or also Cu or Ag depending on the material of the ceramic layers s1 and s2.

According to the above-described wiring board 1c, when the front surface wirings 8 that connect the plurality of probe pads 6 to the plurality of second terminals 7 inevitably intersect with each other on the front surface 4 of the mounting board 2c when viewed from a plane view, the minimum number of inner wirings 8n and second via conductors v may be arranged. Thus, the wiring board for the electronic parts inspecting device mainly having the front surface wirings 8 and including inspecting circuits can be securely designed and manufactured in a short time.

Figure 7:
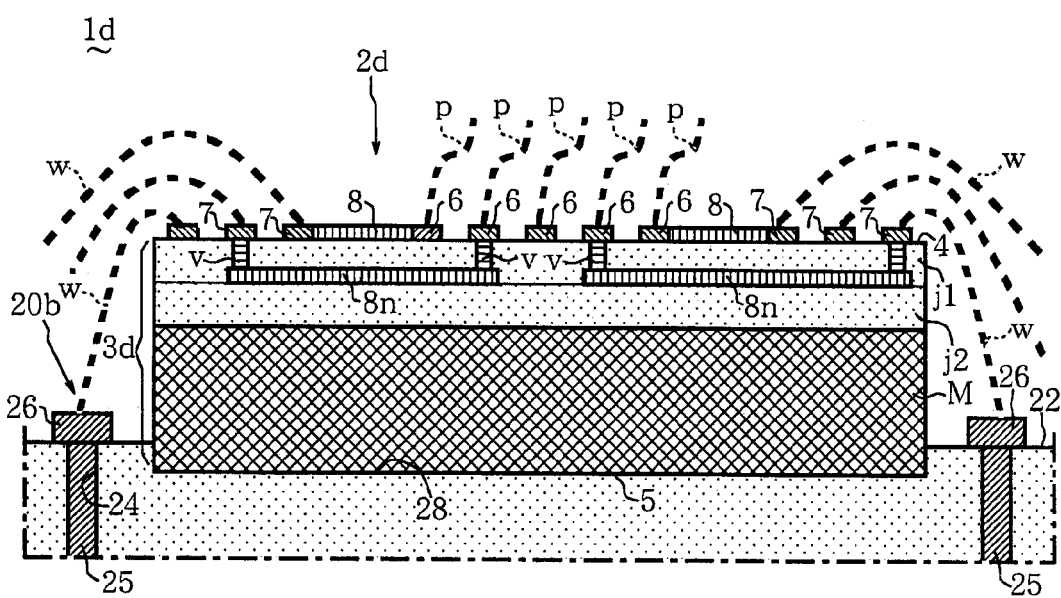
FIG. 7 is a vertical sectional view showing a wiring board for an electronic parts inspecting device according to a further different exemplary embodiment.

FIG. 7 is a partly vertical sectional view showing a wiring board 1d of a further different exemplary embodiment. As shown in FIG. 7, the wiring board 1d includes the base board 20b and a mounting board 2d mounted on the front surface 22 of the base board 20b by inserting a back surface 5 into the recessed part 28 of the base board 20b.

The mounting board 2d includes, as shown in FIG. 7, a board main body 3d including a metal core board M and resin layers (e.g., insulating layers) j1 and j2 made of epoxy resin formed on an upper surface of the board M, probe pads 6, second terminals 7, and front surface wirings 8 formed on a front surface 4 of the board main body 3d in the same manner as described above, inner wirings 8n formed between the layers of the resin layers j1 and j2 in the front surface 4 side of the board main body 3d in the same manner as described above, and second via conductors v which individually connect end parts of the inner wirings 8n to the probe pads 6 or the second terminals 7 and pass through the resin layer j1 in the front surface 4 side in the same manner as described above. The probe pads 6, the second terminals 7 and the front surface wirings 8 are formed with a C plating film and can be precisely formed at fine pitches by a photolithography technique such as a subtractive method.

The same effects achieved with the wiring board 1c can be achieved by the above-described wiring board 1d.

The board main body 3d may be utilized instead of the board main bodies 3 and 3c in the mounting boards 2a and 2c.

Figure 8:
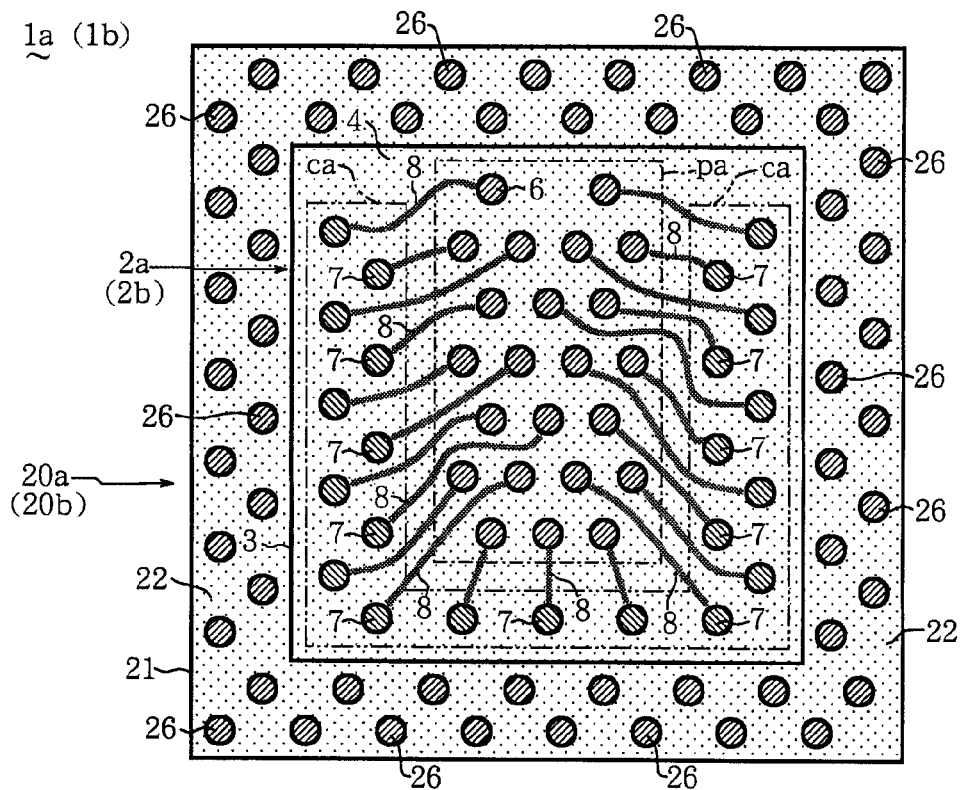
FIG. 8 is a plane view showing a different arrangement on the front side of a mounting board.

FIG. 8 is a plane view showing a modified form of the mounting board 2a or 2b of the wiring board 1a or 1b. The mounting board 2a or 2b is mounted on an upper part of a central part on a front surface 22 of the same base board 20a or 20b as described above. On a front surface 4 of the mounting board 2a or 2b having a substantially square form from a plane view, a probe pad area pa having a plurality of probe pads 6 formed thereon and having a rectangular form from a plane view is located so as to come close to only one side of the front surface 4. A second terminal area ca having a plurality of second terminals 7 formed thereon and having a substantially U shape from a plane view is located along the three other sides of the front surface 4. The second terminal area ca is located outside the pad area pa and surrounds the pad area pa from three sides.

Figure 9:
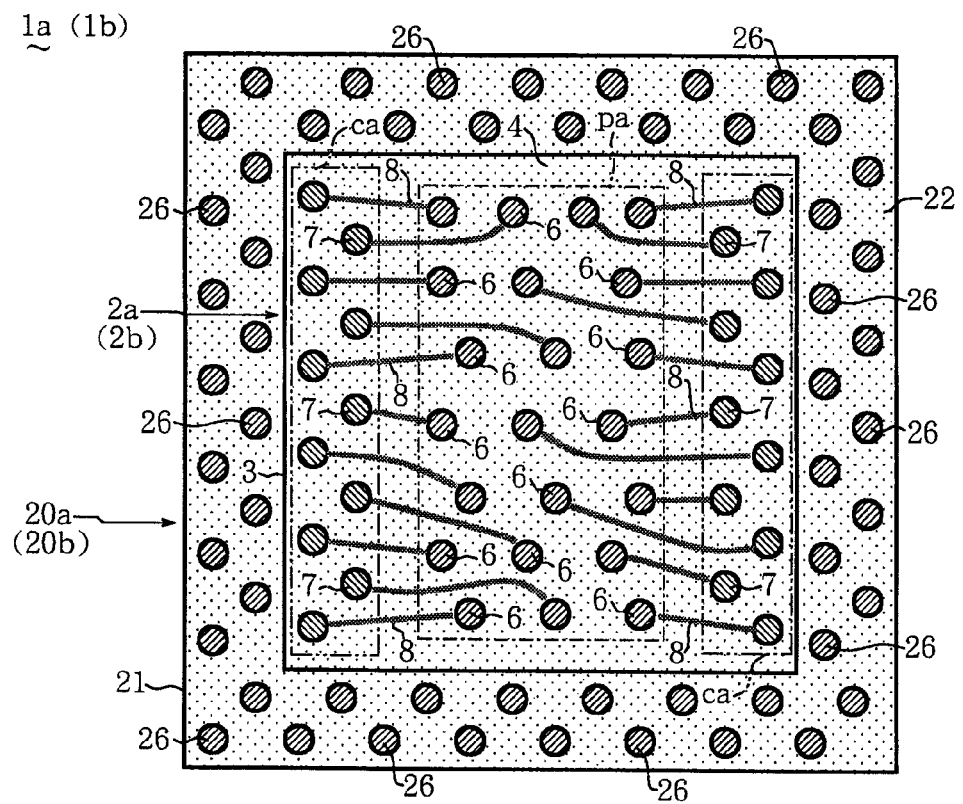
FIG. 9 is a plane view showing a further different arrangement on the front side of the mounting board.

FIG. 9 is a plane view showing another modified form of the mounting board 2a or 2b of the wiring board 1a or 1b. The mounting board 2a or 2b is mounted on an upper part of a central part on a front surface 22 of the same base board 20a or 20b as described above. Then, on a front surface 4 of the mounting board 2a or 2b having a substantially square form from a plane view, a probe pad area pa having a plurality of probe pads 6 formed thereon and having a rectangular form from a plane view is located in a central part between two opposed sides and has end parts coming close to the two remaining sides. One pair of right and left second terminal areas ca, in which second terminals 7 are formed, are located along the two opposed sides to which the pad area pa does not come close. The pair of second terminal areas ca have relatively elongated rectangular forms from a plane view and are located outside the pad area pa to hold the pad area pa from right and left sides.

In the mounting board 2a or 2b shown in FIGS. 8 and 9, when a part of probe pads is electrically connected to a part of the second terminals 7 through the inner wirings 8n and a pair of second via conductors v, the forms shown in FIGS. 8 and 9 may be respectively applied to the surfaces 4 of the mounting boards 2c and 2d of the wiring board 1c and 1d.

Figure 10:
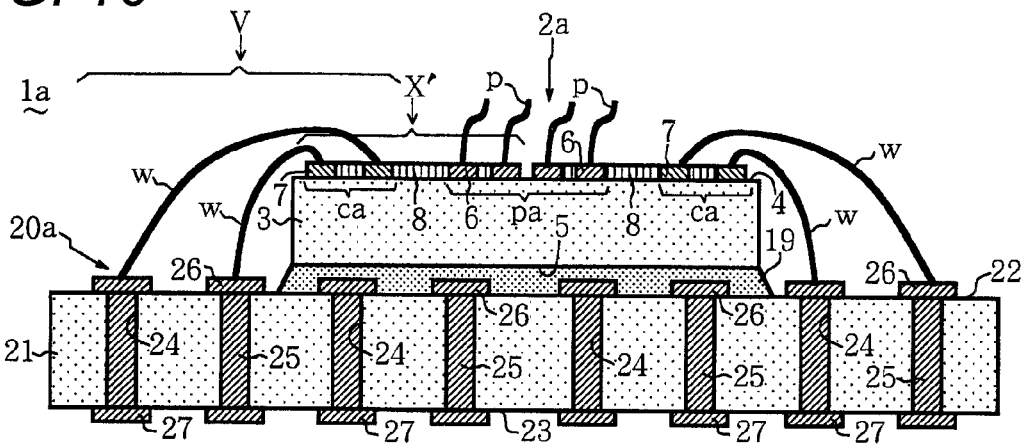
FIG. 10 is a vertical sectional view of a wiring board for an electronic parts inspecting device similar to FIG. 1.
Figure 11:
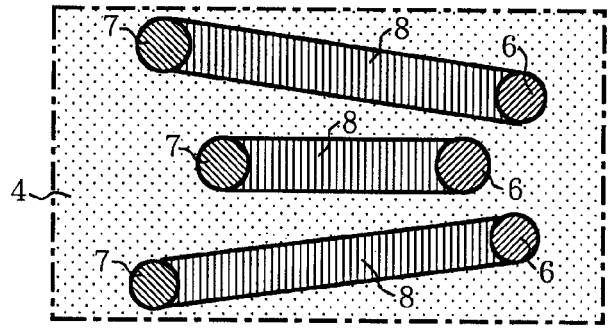
FIG. 11 is an enlarged plane view showing section X' of FIG. 10.
Figure 12:
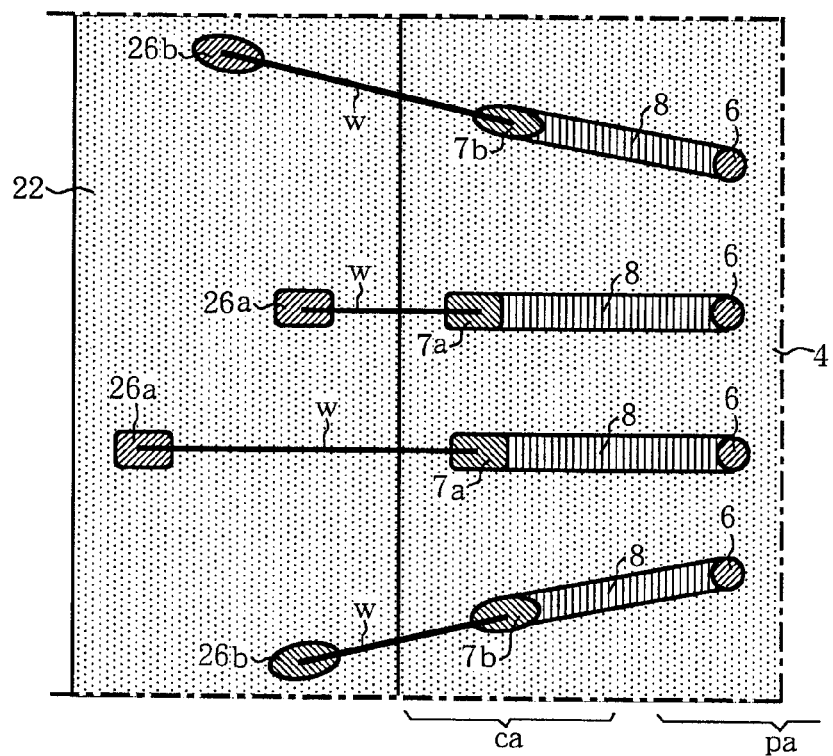
FIG. 12 is an enlarged plane view showing section V of FIG. 10.

FIG. 10 is a vertical sectional view similar to FIG. 1 showing the wiring board 1a. FIG. 11 is an enlarged view showing section X' of FIG. 10. FIG. 12 is an enlarged view showing section V of FIG. 10.

As shown in FIG. 11, when the diameters (width) of the pad 6 for the probe and the second terminal 7, formed on the front surface 4 of the mounting board 2a, are set to the same width as the width of the front surface wiring 8 that connects the probe 6 to the second terminal 7, if the front surface wiring 8 is applied to the power circuit or the ground circuit, an electric resistance can be lowered.

Further, as shown in FIG. 12, a second terminal 7a having a rectangular shape from a plane view is formed on the front surface 4 of the mounting board 2a. A first terminal 26a having the same shape is also formed on the front surface 22 of the base board 20a. Long sides of the terminals 7a and 26a are oriented same direction from a plane view, and the bonding wire w that connects both the terminals 7a and 26a together is substantially parallel thereto.

Further, as shown in upper and lower parts of FIG. 12, a second terminal 7b having an elliptic shape from a plane view is formed on the front surface 4 of the mounting board 2a. A first terminal 26b having the same shape is also formed on the front surface 22 of the base board 20a. Major axes of the terminals 7b and 26b are oriented in the same direction from a plane view, and the bonding wire w that connects both the terminals 7b and 26b together is substantially parallel thereto.

As described above, when the direction of the bonding wire w is set to be parallel to or in a parallel state to the long sides of the second terminal 7a and the first terminal 26a having the rectangular shapes or the major axes the second terminal 7b and the first terminal 26b having the elliptic shapes, the bonding wire w hardly shifted along the parallel direction due to external forces. Thus, durability is improved.

Further, a polygonal form such as an oval form, a rhombic form, or a polygon having six or more sides may be used in place of the elliptic form. The long sides of the second terminal 7a and the first terminal 26a, the major axes of the second terminal 7b and the first terminal 26b and direction of the bonding wire w are not necessarily located along the radial direction from a plane view.

Now, a manufacturing method of the wiring board 1a will be described below.

Figure 13:
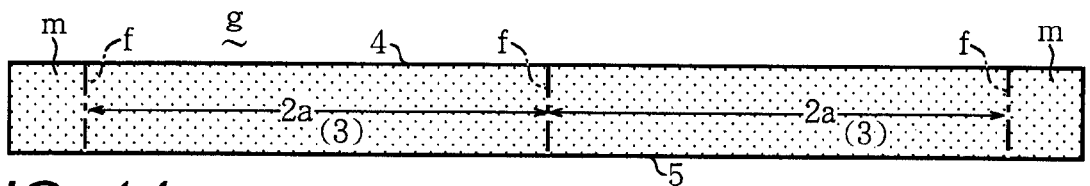
FIG. 13 is a schematic view showing a step in the production process of the wiring board for the electronic parts inspecting device.

Suitable amounts of a resin binder and solvent are previously respectively mixed with alumina powder to obtain a ceramic slurry. The ceramic slurry is changed to a sheet by a doctor blade method to manufacture a green sheet g that is a single layer having a front surface 4 and a back surface 5 as shown by a sectional view in FIG. 13. A dashed line shown in FIG. 13 shows a virtual surface to be cut (a boundary) f that is a grid shape from a plane view. Between the virtual surfaces f, areas of the mounting board 2a which will become the board main body 3 are located, and a frame shaped lug part m is located outside the virtual surfaces f.

Figure 14:
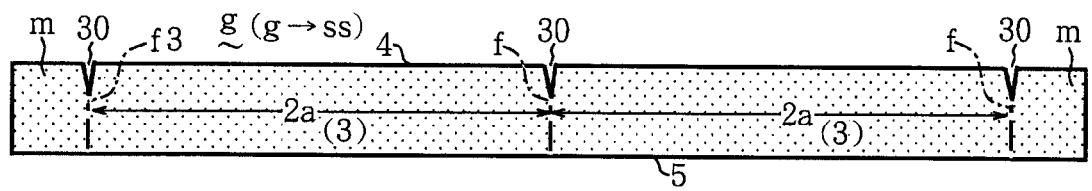
FIG. 14 is a schematic view showing a step in the production process subsequent to that shown in FIG. 13.

Then, as shown in FIG. 14, a grooving work for inserting a cutting edge side of a knife (not shown) is applied along the surface f to be cut which is exposed on the front surface 4 side of the green sheet g to form a V-shaped recessed groove 30 in a grid pattern, when viewed from a plane view. Then, the green sheet g having the recessed groove 30 formed on the front surface 4 is sintered at a prescribed temperature to obtain a ceramic sheet ss.

Figure 15:
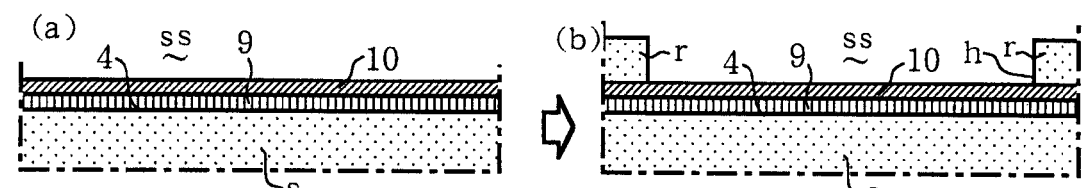
FIG. 15 is an enlarged view showing a step in the production process subsequent to that shown in FIG. 14.

Further, as shown by the enlarged sectional view of FIG. 15(a), the front surface 4 of each area of the mounting board 2a is smoothed. A spattering process (e.g., a physical vapor deposition method) by an ion beam is applied to the entire surface of the front surface 4 to sequentially coat the front surface 4 with a Ti thin film layer 9 and a Cu thin film layer 10. Then, as shown in FIG. 15(b), after a resist layer r made of a photosensitive resin is formed on an entire surface of the Cu thin film layer 10, a photolithography technique is applied to the resist layer r to form a plurality of through holes h with elongated oval shapes from a plane view at prescribed positions. The through hole h may have a form when viewed from a plane view which has circular parts at both ends and a linear part for connecting the circular parts.

Figure 16:
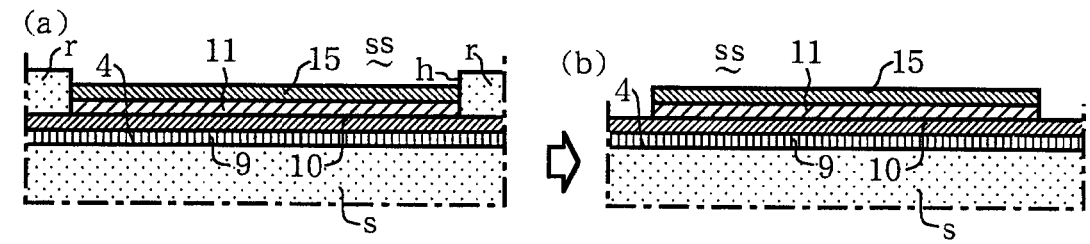
FIG. 16 is an enlarged view showing a step in the production process subsequent to that shown in FIG. 15.

Subsequently, as shown in FIG. 16(a), two kinds of electrolytic metal plating processes are sequentially applied to the Cu thin film layer 10 exposed on a bottom surface of the through hole h to sequentially coat the Cu thin film layer with a Cu plating layer 11 and an Ni plating layer 15. Then, as shown in FIG. 16(b), the resist layer r is allowed to come into contact with developing solution, is peeled off, and is removed. Further, as shown in FIG. 17(a), parts of the Ti thin film layer 9 and the Cu thin film layer 10 which are not coated with the Cu plating layer 11 and the Ni plating layer 15 are allowed to come into contact with etching liquid and are removed.

Figure 17:
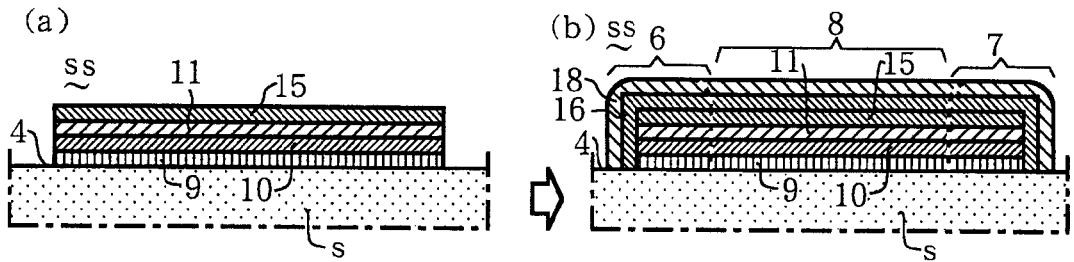
FIG. 17 is an enlarged view showing a step in the production process subsequent to that shown in FIG. 16.

Then, two kinds of non-electrolytic plating processes are sequentially applied to entire surfaces of four layers of the Ti thin film layer 9, the Cu thin film layer 10, the Cu plating layer 11, and the Ni plating layer 15 that generally have the elongated oval shape from a plane view to sequentially apply thereto an Ni plating layer 16 having the thickness of about 1 to several μm and an Au plating layer 18 having the thickness of about 0.03 to 0.1 μm as shown in FIG. 17(b). As a result, a probe pad 6, an outer connecting terminal 7, and a surface wiring 8 is formed which is integrally formed and generally has the elongated oval shape. As shown by a broken line in FIG. 17(b), the pad 6 and the terminal 7 may have circular shapes from a plane view and the pad 6 may be connected to the terminal 7 by the linear front surface wiring 8.

Figure 18:
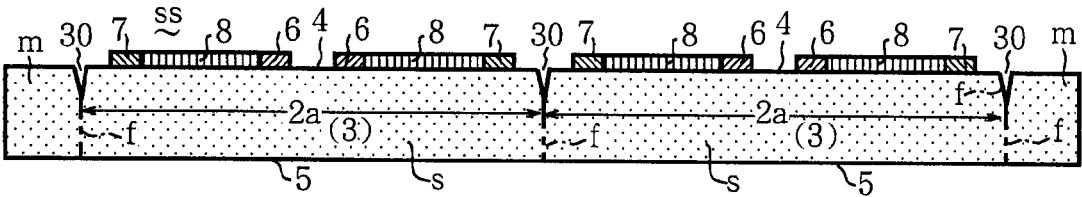
FIG. 18 is a schematic view showing a step in the production process subsequent to that shown in FIG. 17.

Consequently, as shown in FIG. 18, on the front surface 4 of each area of the mounting board 2a (the wiring board 1a) of the ceramic sheet ss for manufacturing many wiring boards, there are formed the plurality of probe pads 6 located in a central side pa, the plurality of outer terminals 7 located in a peripheral side ca and the front surface wirings 8 for individually connecting them together.

Figure 19:
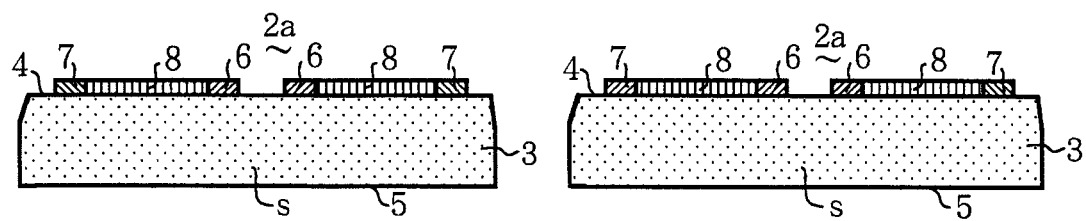
FIG. 19 is a schematic view showing a step in the production process subsequent to that shown in FIG. 18.

Further, the ceramic sheet ss is divided along the recessed grooves 30 shown in FIG. 18 to form the individual wiring boards 1a. Thus, as shown in FIG. 19, the mounting board 2a can be obtained which has the probe pads 6, the outer connecting terminals 7 and the front surface wirings 8 on the front surface 4 of each board main body 3.

Then, as shown in FIG. 1 and FIG. 4, after the mounting board 2a is mounted on the front surface 22 of the base board 20a through the bonding agent 19 or on the front surface 22 of the base board 20b by inserting the back surface 5 side into the recessed part 28 located on the front surface 22 of the base board 20b, the bonding wires w are individually attached respectively between the outer connecting terminals 7 of the mounting boards 2a and the first terminals 26 of the base boards 20a and 20b.

In order to obtain the above-described wiring board 1c, green sheets g of two layers having different thickness are prepared. A process is carried out in which an unsintered via conductor v is allowed to pass through the green sheet g of the upper layer, and an electrically conductive paste as an inner wiring 8n is formed on the surface of the green sheet g of the lower layer, and then these layers are laminated. Subsequently, the above-described processes are respectively carried out so that the mounting board 2c can be manufactured.

Further, when the above-described metal core board M is added to the above-described green sheets g of the two layers, the above-described wiring board 2d can be manufactured. Further, in place of a spattering process by the ion beam, a vapor deposition method by electron beam heating or laser heating may be used.

In addition thereto, the mounting boards 2a to 2c may be separately formed by shearing along the surfaces f to be cut without forming the recessed grooves 30.

According to the method of manufacturing the wiring boards 1a to 1c as described above, since the physical vapor deposition method such as the spattering process is applied only to the front surface 4 of the ceramic sheet ss obtained by sintering the green sheet g to form the probe pads 6, the second terminals 7 and the front surface wirings 8, the time necessary for designing and/or producing the wiring board 1a to 1c can be shortened and the wiring board can be easily and inexpensively manufactured with a relatively small number of jigs.

The present invention is not limited to the above-described exemplary embodiments.

For instance, the base board may have a board main body made of a resin such as an epoxy resin.

Further, the second terminals of the mounting board may be connected to the first terminals of the base board by connectors, rather than bonding wires. Thus, between the plurality of the first terminals and the second terminals, either bonding wires or connectors may be selected to connect the terminals, depending on the parts to be connected.

Further, the front surfaces and the back surfaces of the board main body of the base board as well as the mounting board may be formed in rectangular shapes from a plane view.

Further, the base board on which one mounting board is mounted may have a form in which two or more upper and lower layers are laminated, and the second connectors of the mounting board may be individually connected to the first terminals of the base board having the two upper and lower layers by bonding wires or connectors.

In addition thereto, a plurality of mounting boards may be mounted on different and mutually separated positions of the front surface of one base board having front and back surfaces of a relatively large area.

According to embodiments of the present invention, a wiring board for an electronic parts inspecting device can be provided which can precisely and rapidly carry out a prescribed inspection for each of the electronic part and requires a relatively shortened a time for design and production, and that can be easily and inexpensively manufactured with a relatively small number of jigs.

DESCRIPTION OF REFERENCE NUMERALS 1a to 1d: wiring board for electronic parts inspecting device
2a to 2d: mounting board
4: front surface of mounting board
5: back surface of mounting board
6: probe pad
7, 7a, 7b: second terminal
8: front surface wiring
8n: inner wiring
19: bonding agent
20a, 20b: base board
22: front surface of base board
23: back surface of base board
25: first via conductor
26, 26a, 26b: first terminal
27: outer terminal
28: recessed part
P: probe
W: bonding wire
V: second via conductor
s1, s2: ceramic layer (insulating layer)
j1, j2: resin layer (insulating layer)
g: green sheet
ss: ceramic sheet

What is claimed is:

1. A wiring board for an electronic parts inspecting device, comprising:
    a base board made of an insulating material having a front surface and a back surface, the base board including:
        a plurality of first via conductors having two ends and passing between the front surface and the back surface, and
        first terminals on the front surface and outer terminals on the back surface that are connected to the ends of the first via conductors, the outer terminals being configured to electrically connect to an external part; and
    a mounting board on the front surface of the base board having at least a front side formed with an insulating material, the mounting board including:
        a lower insulating layer,
        an upper insulating layer on the lower insulating layer, such that, a front side of the upper insulating layer forms the front side of the mounting board,
        a plurality of probe pads for attaching probes,
        a plurality of second terminals that are electrically connected to the first terminals of the base board,
        front surface wirings that connect the probe pads to the second terminals,
        inner wirings between the upper insulation layer and the lower insulation layer, and
        second via conductors that pass through the upper insulation layer;
    wherein one or more of the probe pads are electrically connected to one or more of the second terminals through the inner wirings and the second via conductors; and
    wherein the plurality of second terminals, the front surface wirings, and the plurality of probe pads are provided on the same plane.

2. A wiring board for an electronic parts inspecting device according to claim 1,
    wherein the probe pads are formed in a central portion of the front side of the mounting board, the second terminals are formed in a peripheral portion of the front side of the mounting board, and the peripheral portion surrounds the central portion.

3. A wiring board for an electronic parts inspecting device according to claim 1,
    wherein a width of the probe pads, a width of the second terminals, and a width of the front surface wirings are the same.

4. A wiring board for an electronic parts inspecting device according to claim 1,
    wherein the mounting board is mounted on the front surface of the base board by bonding a back side of the mounting board to the front surface of the base board or inserting the back side of the mounting board into a recessed part provided on the front surface of the base board.

5. A wiring board for an electronic parts inspecting device according to claim 1,
    wherein the first terminals are connected to the second terminals by bonding wires or connectors.

6. A wiring board for an electronic parts inspecting device according to claim 1,
    wherein from a plane view the first terminals and the second terminals have a rectangular shape, elliptic shape, oval shape, rhombic shape, or polygonal shape, and a long side or major axis of the first terminals and the second terminals are substantially located along a direction of the bonding wires or connectors.

7. A method of manufacturing the wiring board for an electronic parts inspecting device of claim 1, the method of manufacturing the wiring board comprising:
    sintering a green sheet having a front surface and a back surface to form a ceramic sheet, the green sheet having a plurality of board areas; and
    forming the plurality of probe pads, the plurality of second terminals, and the plurality of front surface wirings by applying a physical vapor deposition or a plating process to a front surface of the plurality of board areas to form a plurality of mounting boards.

8. The method according to claim 7, further comprising:
    dividing the ceramic sheet to separate the plurality of board areas to form a plurality of mounting boards after the process of forming the probe pads, the second terminals, and the front surface wirings.

* * * * *